United States Patent
Hsu et al.

(10) Patent No.: US 7,741,789 B2
(45) Date of Patent: Jun. 22, 2010

(54) LOCKED PHASE ACTIVE POWER CURRENT CONTROL CIRCUIT

(75) Inventors: Cheng-Chia Hsu, Chupei (TW); Teng-Kang Chang, Hsinchu County (TW); Yun-Ching Wu, Hsinchu (TW)

(73) Assignee: Logah Technology Corp., Chupei, Hsinchu County (TW)

( * ) Notice: Subject to any disclaimer, the term of this patent is extended or adjusted under 35 U.S.C. 154(b) by 256 days.

(21) Appl. No.: 11/859,447

(22) Filed: Sep. 21, 2007

(65) Prior Publication Data
US 2009/0079478 A1    Mar. 26, 2009

(51) Int. Cl.
*H05B 41/24* (2006.01)
(52) U.S. Cl. .................. 315/282; 315/291; 363/41
(58) Field of Classification Search .......... 315/224, 315/219, 247, 244, 276, 308, 312, 311, 307, 315/282, 291; 363/40–41, 25, 17, 37, 89; 323/282–288, 224, 225
See application file for complete search history.

(56) References Cited

U.S. PATENT DOCUMENTS 5,063,332 A * 11/1991 El-Hamamsy et al. ........ 315/48
7,515,446 B2 * 4/2009 Lin ............................. 363/98

* cited by examiner

*Primary Examiner*—Rajnikant B Patel
(74) *Attorney, Agent, or Firm*—Pai Patent & Trademark Law Firm; Chao-Chang David Pai

(57) ABSTRACT

The locked phase active power current control circuit is composed of a DC source, an electronic switch, a driving transformer, a phase detecting unit, a current intercepting unit and a square wave controller. A DC signal provided by the DC source is converted into a square wave signal by the electronic switch for the driving transformer to operate a load. The electronic switch outputs the square wave signal to the phase detecting unit whereat a phase signal of the square wave is detected and the detected signal is transmitted to the current intercepting unit whereat the detected signal is compared with the current intercepted at the electronic switch, the driving transformer, or the load, and the comparison result is fed back to the square wave controller so as to set the operation frequency of the electronic switch. The essential principle of the present invention is based on the fact that the square wave is in phase with the first harmonic wave.

3 Claims, 9 Drawing Sheets

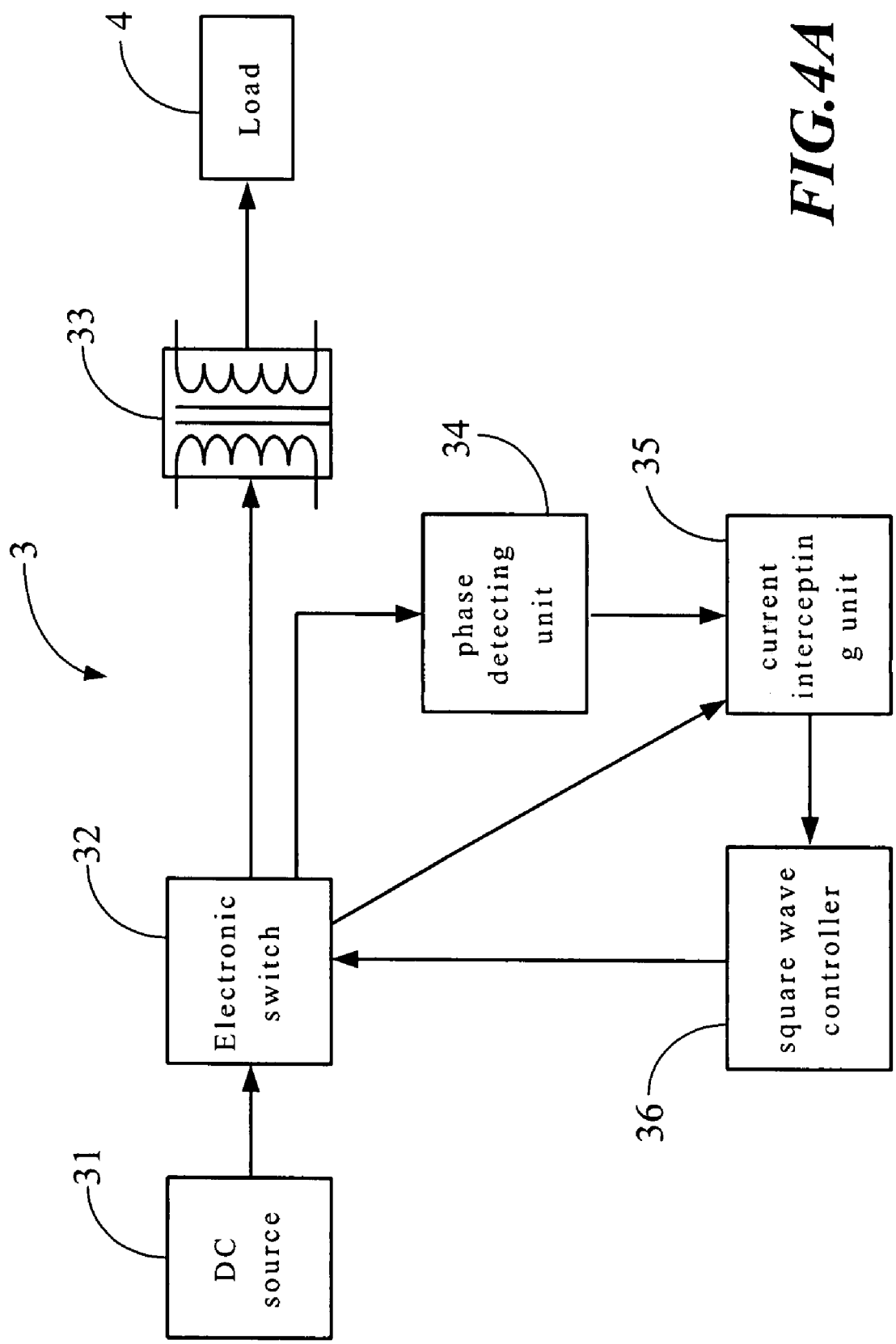

LOCKED PHASE ACTIVE POWER CURRENT CONTROL CIRCUIT

BACKGROUND OF THE INVENTION

1. Field of the Invention

The present invention relates to a locked phase active power current control circuit, and more particularly to a control circuit which is effective in maintaining the brightness of the light used as LCD background lighting source.

2. Description of the Prior Art

FIGS. 1A through 1C are flow charts illustrating conventional load current feedback control schemes. A DC signal provided by a DC source 11 is converted into a square wave signal by an electronic switch 12 for a driving transformer 13 to operate a load 4, and a current detecting unit 14 is employed to detect the current signal from the electronic switch 12 (FIG. 1A), the driving transformer 13 (FIG. 1B) or the load 4 (FIG. 1C) so as to feed the signal back to a square wave controller 15 in order to set the operating frequency of the electronic switch 12.

Indeed, it is effective using the aforesaid control means to attain the aim of the feedback control, but there remain the following problems:

1. The load current composed of $I_R$, $I_L$ and $I_C$ will vary simultaneously with variation of the load, causing difficulties for control and affecting the effectiveness of the feedback.

2. If the above control means is applied to control the LCD background lighting, the brightness of the background light will be uneven.

Due to these defects in the prior art, an improvement is urgently required.

The inventor of the present invention has plunged into this matter for years in order to alleviate these defects and has finally succeeded in coming up with the present invention.

SUMMARY OF THE INVENTION

The main object of the present invention is to provide a locked phase active power current control circuit wherein the DC signal current from a DC source is converted into a rectangular wave signal with an electronic switch to operate a load by a driving transformer according to the principle that the square wave is in the same phase with the first harmonic wave so that it is able to maintain a stable operating frequency of the electronic switch and stabilize the load.

Another object of the present invention is to provide a locked phase active power current control circuit which can be used to control the background light source of LCD to have a uniform brightness.

One more object of the present invention is to provide a locked phase active power current control circuit which can be produced with low cost, and be used stably for a prolonged time.

To achieve the aforesaid objects, the locked phase active power current control circuit according to the present invention is composed of a DC source, an electronic switch, a driving transformer, a phase detecting unit, a current intercepting unit and a square wave controller. A DC signal provided by the DC source is converted into a square wave signal by the electronic switch for the driving transformer to operate a load. At the same time, the electronic switch outputs the square wave signal to the phase detecting unit whereat a phase signal of the square wave is detected, and the detected signal is transmitted to the current intercepting unit. In the current intercepting unit, the detected signal is compared with the current intercepted at the electronic switch, the driving transformer, or the load, and the comparison result is fed back to the square wave controller for setting the operating frequency of the electronic switch.

BRIEF DESCRIPTION OF THE DRAWINGS

FIGS. 4A, 4B and 4C respectively show the operational flow charts in a first, second and third embodiment of the present invention.

DETAILED DESCRIPTION OF THE PREFERRED EMBODIMENTS

Figure 1A:
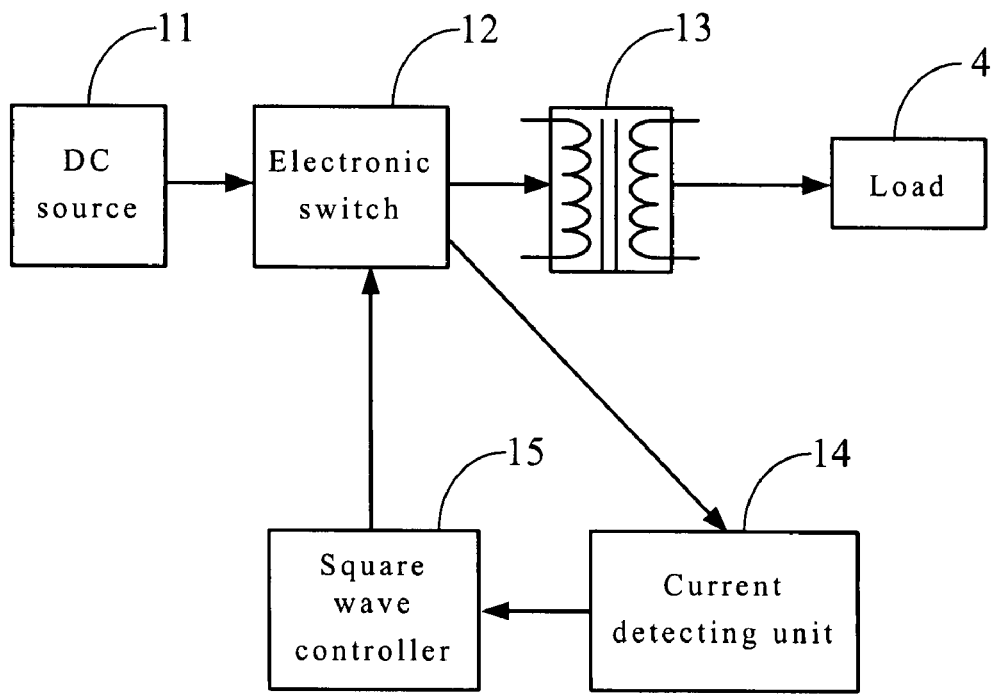
FIGS. 1A, 1B and 1C are flow charts illustrating conventional load current feedback control schemes.
Figure 1B:
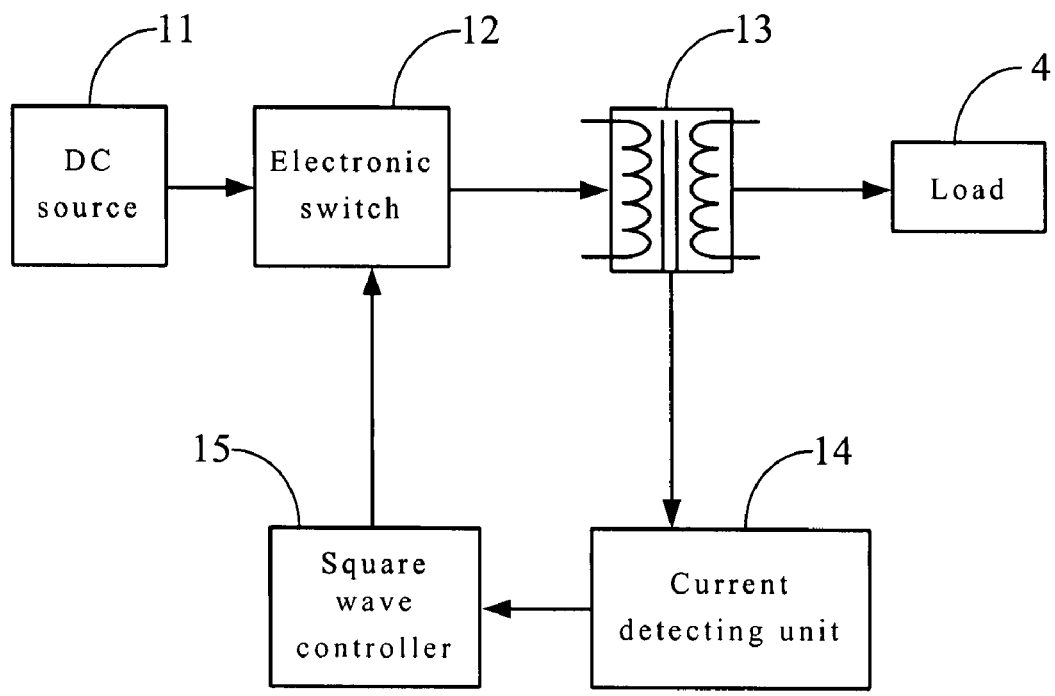
Figure 1C:
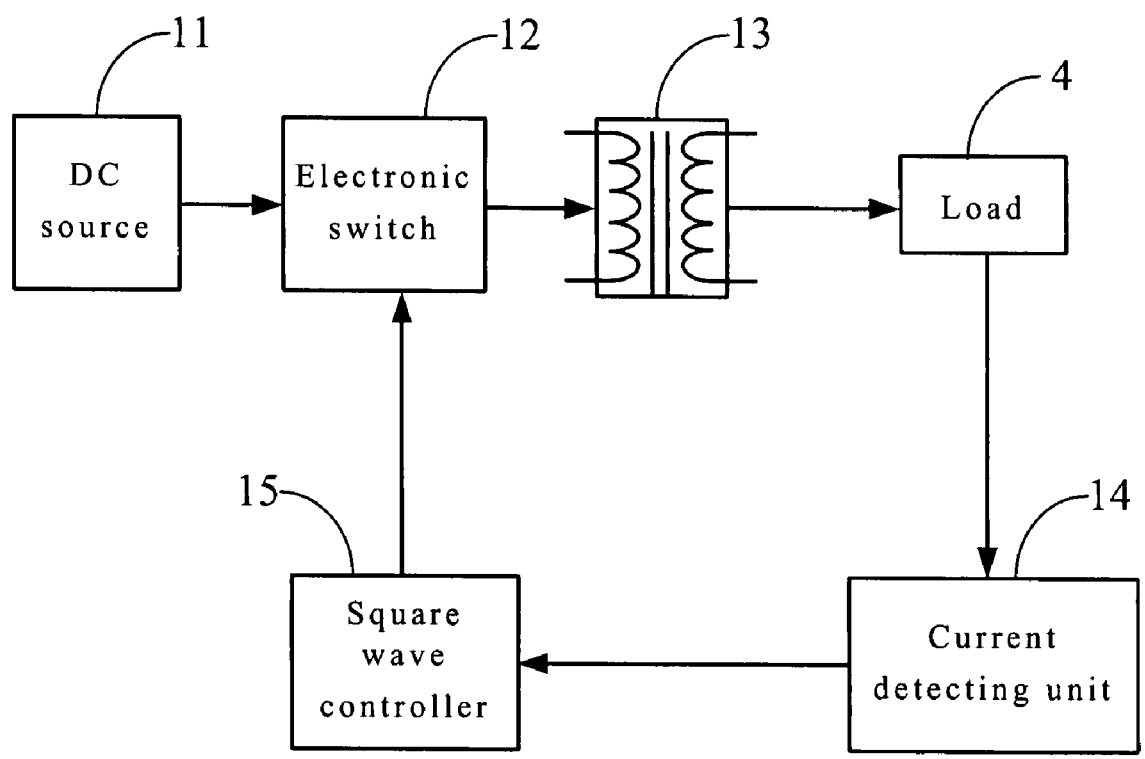
Figure 2A:
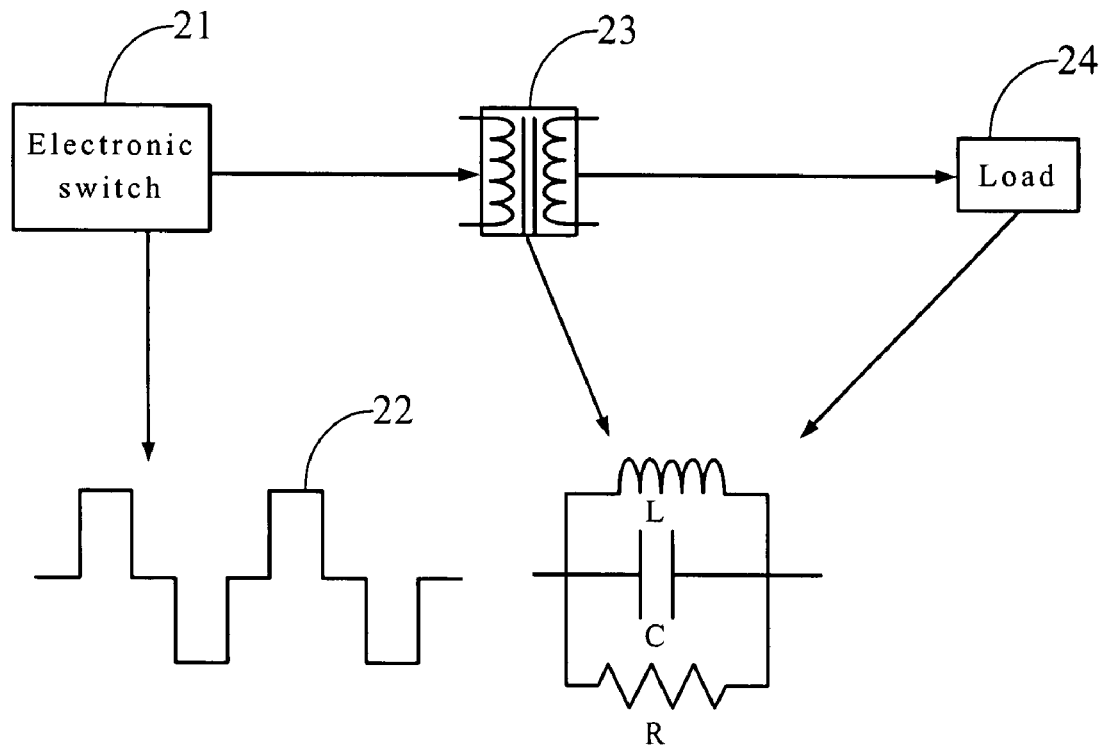
FIG. 2A is an equivalent circuit (1) of the load current feedback control scheme according to the present invention.

FIG. 2A shows an equivalent circuit (1) of the load current feedback control scheme according to the present invention. As shown in FIG. 2A, an electronic switch 21 produces a square wave signal 22, and a driving transformer 23 and a load 24 can be jointly regarded as a combination of resistance (R), inductance (L), and capacitance (C).

Figure 2B:
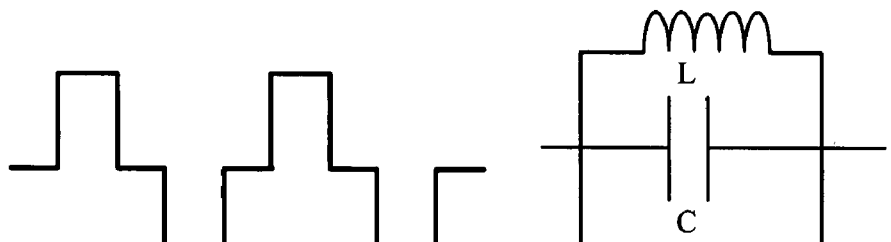
FIG. 2B is an equivalent circuit (2) of the load current feedback control scheme according to the present invention.
Figure 2B:
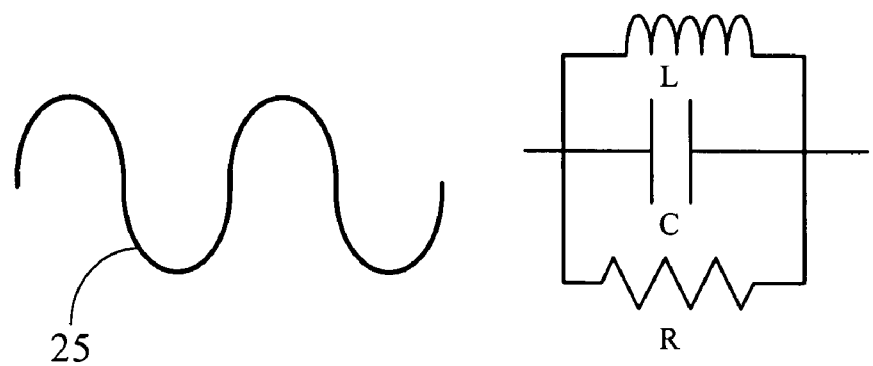

Referring to FIG. 2B, in this equivalent circuit (2) of the present invention, the square wave signal 22 has a first harmonic wave signal of maximum energy, e.g. a sinusoidal wave signal 25 according to Fourier series expansion.

Figure 3A:
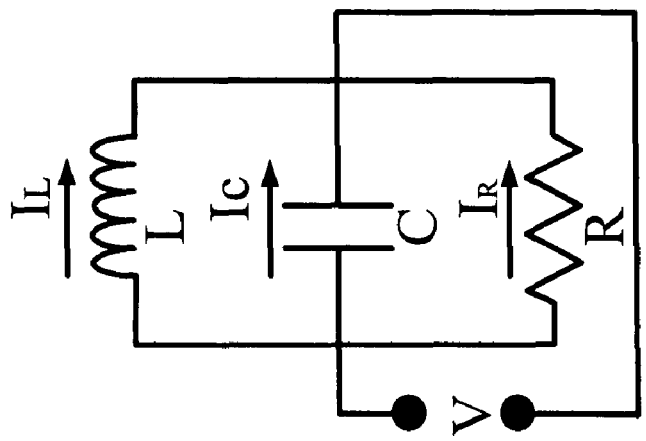
FIG. 3A is a graph of voltage and current wave forms according to the present invention.
Figure 3A:
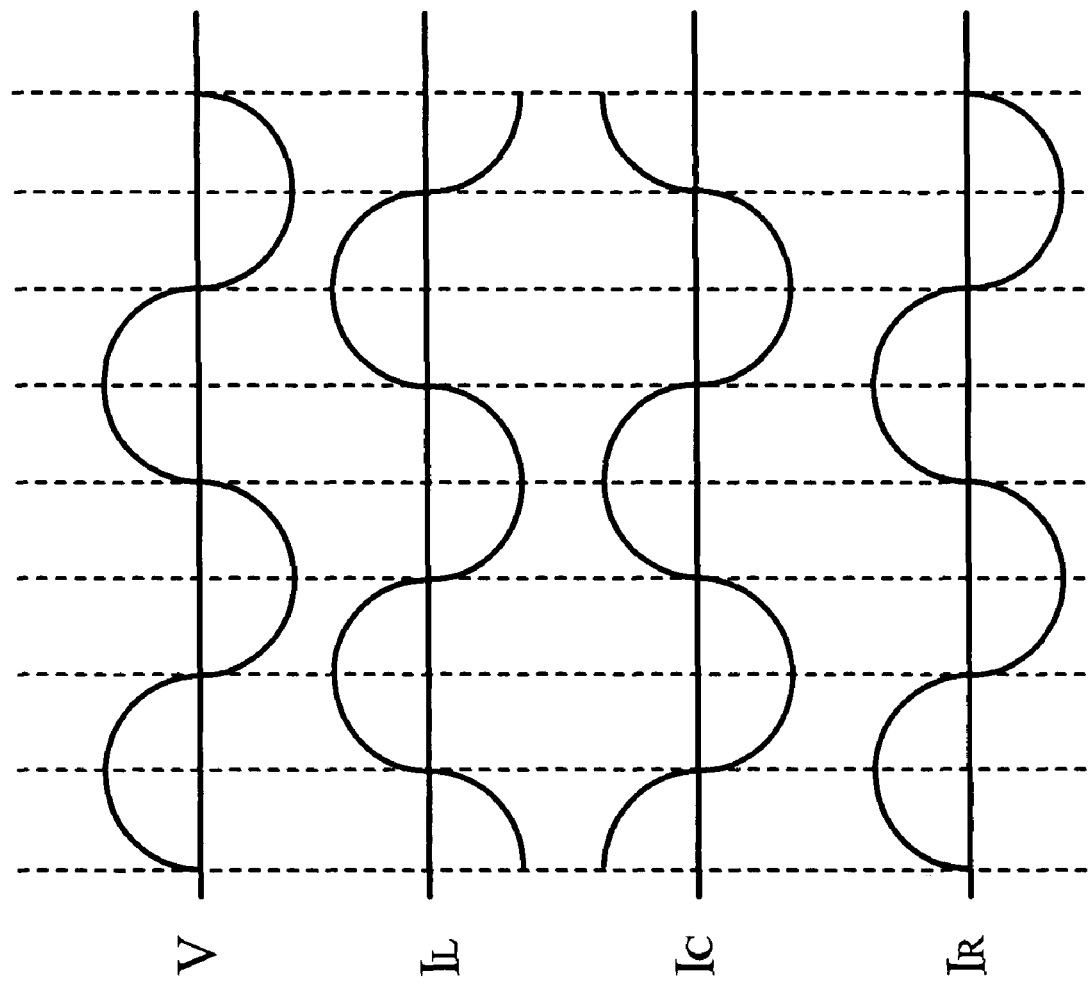

FIG. 3A is a graph of voltage and current wave forms according to the present invention. As described above, the driving transformer 23 and the load 24 can be jointly regarded as a combination of resistance (R), inductance (L), and capacitance (C). When a voltage (V) is applied at two terminals, the current flowing through (R), (L), (C) will respectively be $I_R$, $I_L$, $I_C$, wherein the voltage (V) is in the same phase with current ($I_R$).

Figure 3B:
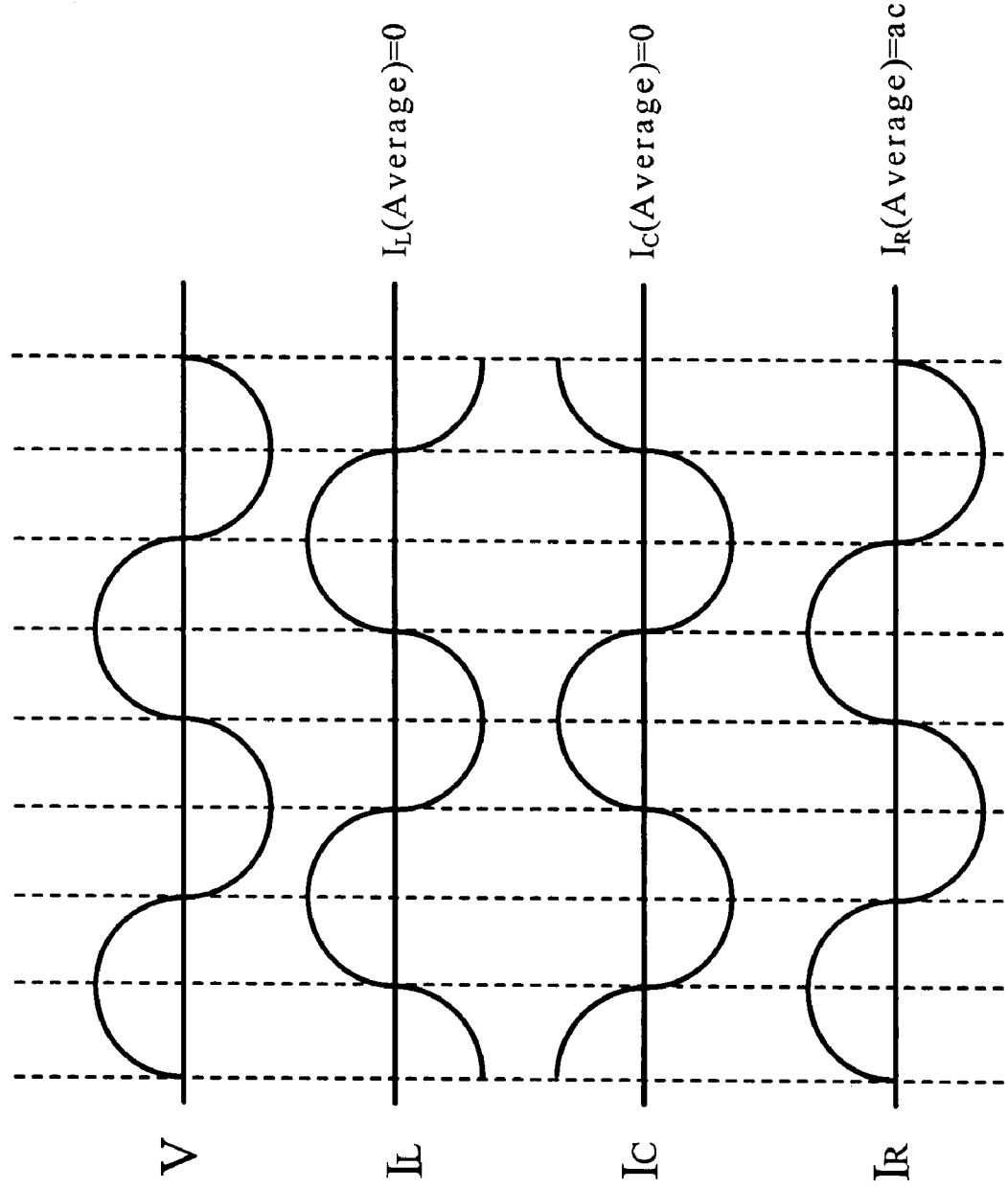
FIG. 3B is a graph of voltage and average current wave forms according to the present invention.

Referring to FIG. 3B, in this graph showing voltage and average current wave forms, $I_L$(average), $I_C$(average) are 0, and $I_R$(average) is an active power current.

Figure 3C:
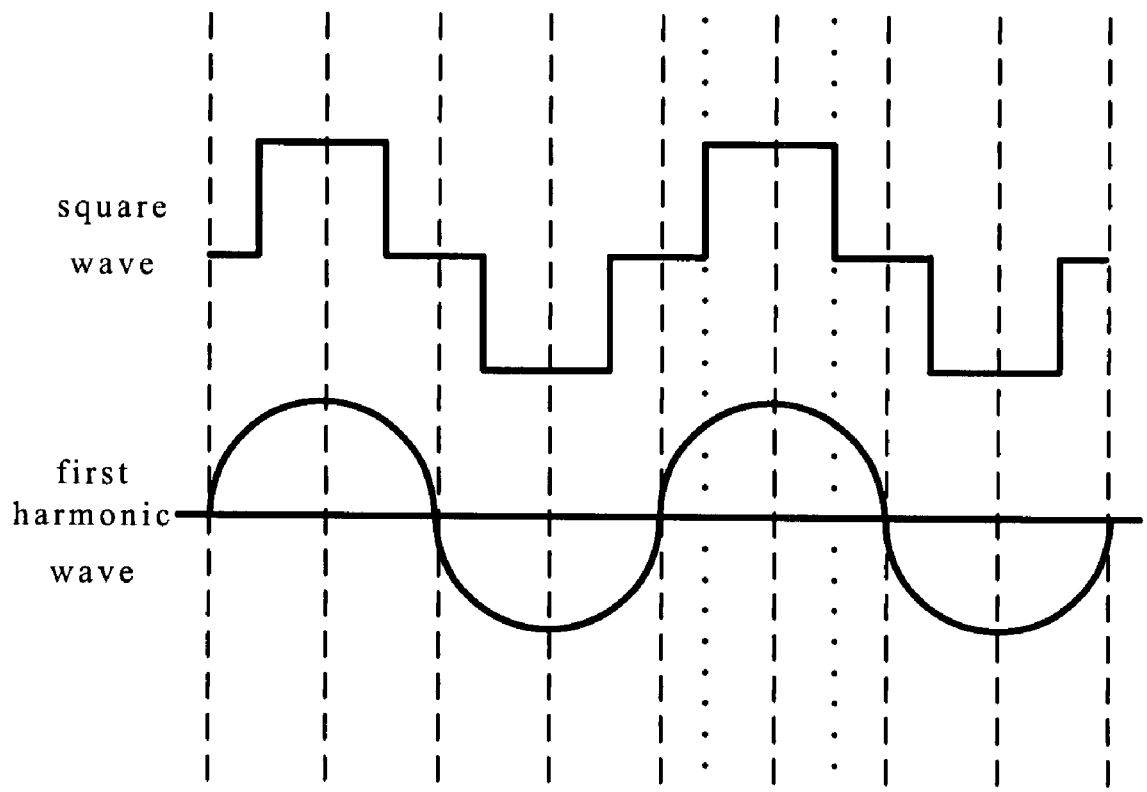
FIG. 3C is a voltage graph of in square wave form and its first harmonic wave according to the present invention.

FIG. 3C shows a voltage graph in square wave form and its first harmonic wave. As shown in FIG. 3C, it clearly shows that the square wave signal 22 is in phase with its first harmonic signal 25, hence the current can be intercepted with respect to the wave form of the square wave signal 22.

FIG. 4A is an operational flow chart in the first embodiment of the present invention, wherein the locked phase active power current control circuit 3 comprises the following elements and functions:

A DC source 31 outputs a DC signal to an electronic switch 32.

The electronic switch 32 receives the DC signal outputted from the DC source 31 and converts it to a square wave signal and outputs the square wave signal to a driving transformer 33 and a phase detecting unit 34.

The driving transformer 33 receives the square wave signal outputted from the electronic switch 32 and supplies it to a load 4 after boosting up the voltage.

A phase detecting unit 34, which receives the square wave signal outputted from the electronic switch 32, detects a phase signal of the square wave and outputs the detected phase signal to a current intercepting unit 35.

The current intercepting unit 35 receives the detected phase signal outputted from the phase detecting unit 34, compares it with a current intercepted at the electronic switch 32, and feeds a comparison result back to a square wave controller 36.

The square wave controller 36 receives the comparison result outputted from the current intercepting unit 35, and sets the operating frequency of the electronic switch 32 based on that comparison result.

Figure 4B:
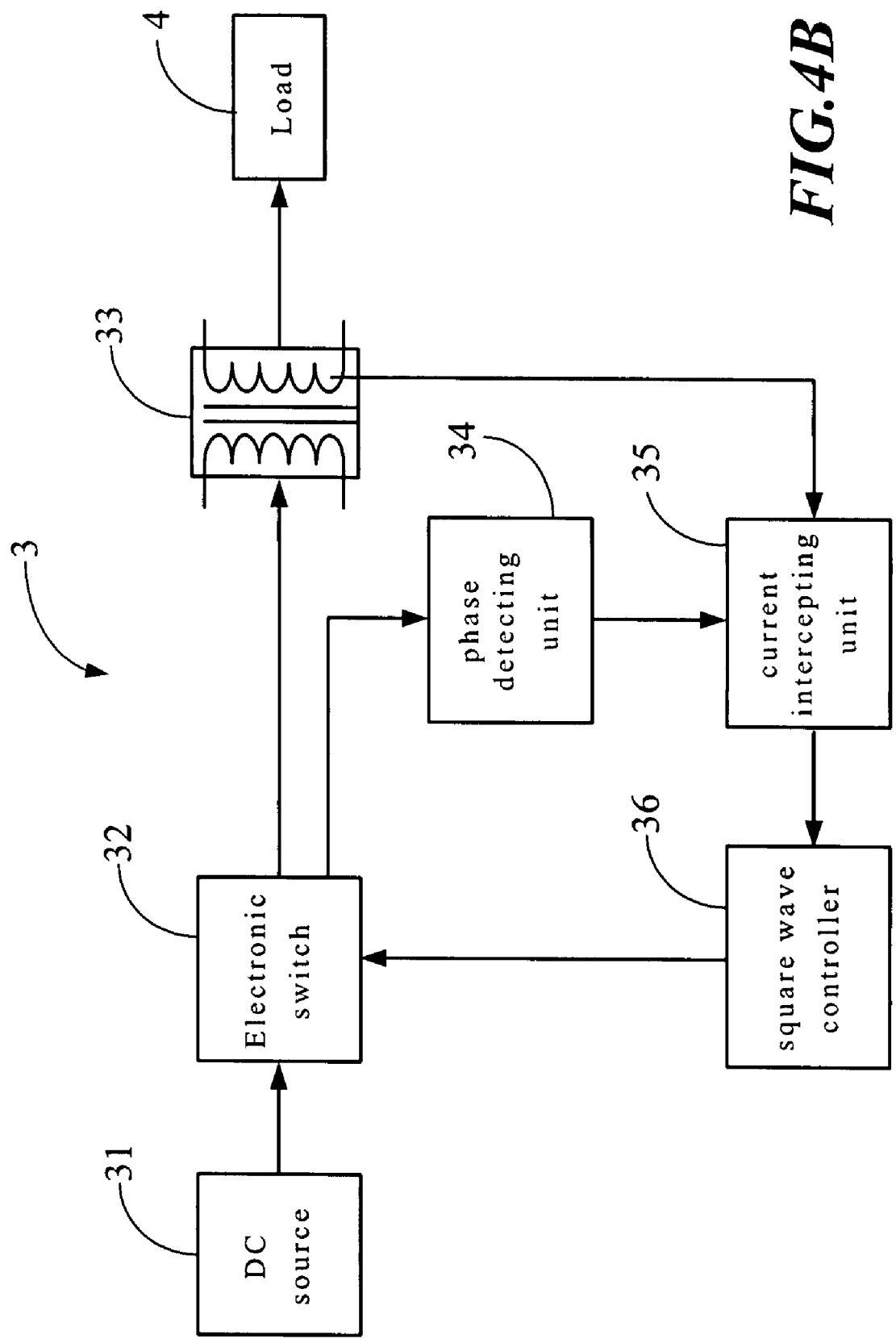

FIG. 4B is an operational flow chart in a second embodiment of the present invention, wherein the locked phase active power current control circuit 3 comprises the following elements and functions:

A DC source 31 provides a DC signal to an electronic switch 32.

The electronic switch 32 receives the DC signal outputted from the DC source 31 and converts it to a square wave signal and outputs the square wave signal to a driving transformer 33 and a phase detecting unit 34.

The driving transformer 33 receives the square wave signal outputted from the electronic switch 32 and supplies it to a load 4 after boosting up the voltage.

A phase detecting unit 34, which receives the square wave signal outputted from the electronic switch 32, detects a phase signal of the square wave and outputs the detected phase signal to a current intercepting unit 35.

The current intercepting unit 35 receives the detected phase signal outputted from the phase detecting unit 34 and compares it with a current intercepted at the driving transformer 33, and feeds a comparison result back to a square wave controller 36.

The square wave controller 36 receives the comparison result outputted from the current intercepting unit 35 and sets the operating frequency of the electronic switch 32 based on that comparison result.

Figure 4C:
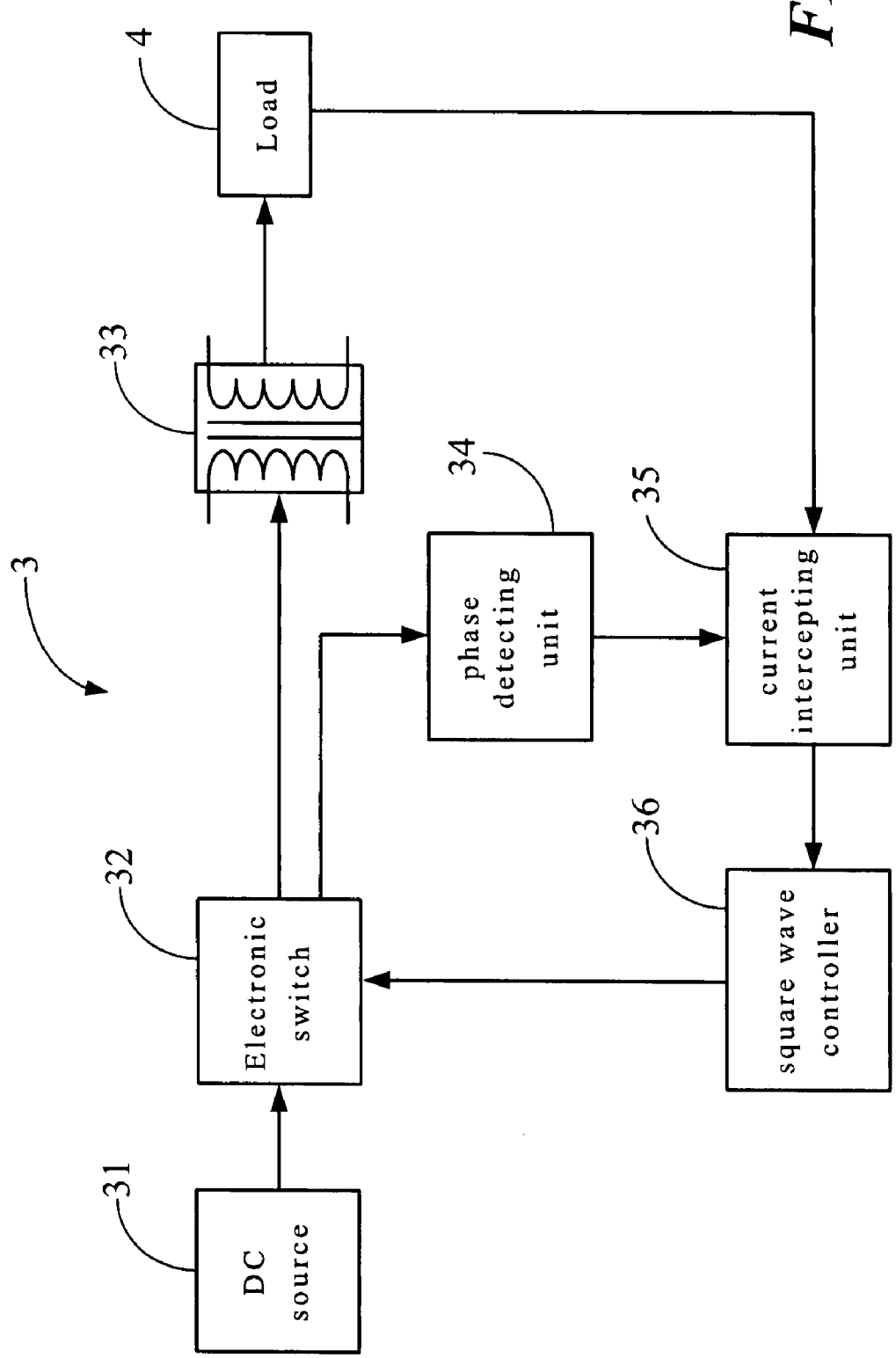

FIG. 4C is an operational flow chart in the third embodiment of the present invention, wherein the locked phase active current control circuit 3 comprises the following elements and functions:

A DC source 31 provides a DC signal to an electronic switch 32.

The electronic switch 32 receives the DC signal outputted from the DC source 31 and converts it to a square wave signal and outputs the square wave signal to a driving transformer 33 and a phase detecting unit 34.

The driving transformer 33 receives the square wave signal outputted from the electronic switch 32 and supplies it to a load 4 after boosting up the voltage.

A phase detecting unit 34, which receives the square wave signal outputted from the electronic switch 32, detects a phase signal of the square wave and outputs the detected phase signal to a current intercepting unit 35.

The current intercepting unit 35 receives the detected phase signal outputted from the phase detecting unit 34 and compares it with a current intercepted at the load 4, and feeds a comparison result back to a square wave controller 36.

The square wave controller 36 receives the comparison result outputted from the current intercepting unit 35 and sets the operating frequency of the electronic switch 32 based on that comparison result.

Based on the above description, the present invention has several noteworthy merits compared with the conventional technology, namely 1. The operational principle of the present invention is based on the fact that the square wave is in phase with its first harmonic wave so that the current can be intercepted according to the wave form of the square wave by means of the phase detecting unit and the current intercepting unit thereby stabilizing the operation of the electronic switch and the load with the square wave controller.

2. The control circuit of the present invention is suitable for effectively controlling the LCD background light source to maintain a balanced current resulting in obtaining a uniform brightness.

3. The product according to the present invention is able to work stably for a long time with reduced production cost.

Although the present invention has been disclosed and illustrated with respect to preferred embodiments thereof, it is to be understood that the invention is not to be so limited and that other changes and modifications can be made within the full intended scope of the invention as hereinafter claimed.

What is claimed is:

1. Locked phase active power current control circuit comprising:
   a DC source for providing a DC signal to an electronic switch;
   said electronic switch for receiving said DC signal outputted from said DC source and converting it to a square wave signal and outputting said square wave signal to a driving transformer and a phase detecting unit;
   said driving transformer for receiving said square wave signal outputted from said electronic switch and supplying it to a load after boosting up the voltage;
   said phase detecting unit for receiving said square wave signal outputted from said electronic switch and detecting a phase signal of said square wave and outputting said detected phase signal to a current intercepting unit;
   said current intercepting unit for receiving said detected phase signal outputted from said phase detecting unit and comparing said detected phase signal with a current intercepted at said electronic switch to feed a comparison result back to a square wave controller; and
   said square wave controller for receiving said comparison result outputted from said current intercepting unit and setting an operating frequency of said electronic switch base on said comparison result.

2. Locked phase active power current control circuit comprising:
   a DC source for providing a DC signal to an electronic switch;
   said electronic switch for receiving said DC signal outputted from said DC source and converting it to a square wave signal and outputting said square wave signal to a driving transformer and a phase detecting unit;
   said driving transformer for receiving said square wave signal outputted from said electronic switch and supplying it to a load after boosting up the voltage;
   said phase detecting unit for receiving said square wave signal outputted from said electronic switch and detecting a phase signal of said square wave and outputting said detected phase signal to a current intercepting unit;
   said current intercepting unit for receiving said detected phase signal outputted from said phase detecting unit and comparing said detected phase signal with a current intercepted at said driving transformer to feed a comparison result back to a square wave controller; and
   said square wave controller for receiving said comparison result outputted from said current intercepting unit and setting an operating frequency of said electronic switch based on said comparison result.

3. Locked phase active power current control circuit comprising:
- a DC source for providing a DC signal to an electronic switch;
- said electronic switch for receiving said DC signal outputted from said DC source and converting it to square wave signal and outputting said square wave signal to a driving transformer and a phase detecting unit;
- said driving transformer for receiving said square wave signal outputted from said electronic switch and supplying it to a load after boosting up the voltage;
- said phase detecting unit for receiving said square wave signal outputted from said electronic switch and detecting a phase signal of said square wave and outputting said detected phase signal to a current intercepting unit;
- said current intercepting unit for receiving said detected phase signal outputted from said phase detecting unit and comparing said detected phase signal with a current intercepted at said load to feed a comparison result back to a square wave controller; and
- said square wave controller for receiving said comparison result outputted from said current intercepting unit and setting an operating frequency of said electronic switch based on said comparison result.

* * * * *